(12) United States Patent
Kadosh et al.

(10) Patent No.: US 6,403,979 B1
(45) Date of Patent: Jun. 11, 2002

(54) TEST STRUCTURE FOR MEASURING EFFECTIVE CHANNEL LENGTH OF A TRANSISTOR

(75) Inventors: Daniel Kadosh, Austin; Jon D. Cheek, Round Rock, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/780,834

(22) Filed: Feb. 9, 2001

(51) Int. Cl.$^7$ ............................................... H01L 23/58
(52) U.S. Cl. ........................................................ 257/48
(58) Field of Search ........................... 257/48, 536–538, 257/543

(56) References Cited

U.S. PATENT DOCUMENTS 5,895,960 A * 4/1999 Fritz et al. .................. 257/359

OTHER PUBLICATIONS

D.S. Perloff, "A Van Der Pauw Resistor Structure for Determining Mask superposition errors on semiconductor slices" in Solid State Electronics, Aug. 21, 1978, vol. 21, pp. 1013–1018.*

* cited by examiner

*Primary Examiner*—Minh Loan Tran
*Assistant Examiner*—Thomas Dickey
(74) *Attorney, Agent, or Firm*—Williams, Morgan & Amerson, P.C.

(57) ABSTRACT

A test structure for use in determining an effective channel length of a transistor is disclosed herein. The test structure comprises a first resistor comprised of a first doped region formed in a semiconducting substrate between a first pair of spaced-apart structures positioned above the substrate, the first resistor having a first width defined by the spacing between the first pair of structures, a second resistor comprised of a second doped region formed in the substrate between a second pair of spaced-apart structures positioned above the substrate, the second resistor having a second width defined by the spacing between the second pair of structures, the second width being greater than the first width, and a plurality of conductive contacts electrically coupled to each of the first and second doped regions. The method disclosed herein comprises determining the extent of lateral encroachment of the doped regions under the structures based upon the following formula: $\Delta w = (R_1 W_1 - R_2 W_2)/(R_1 - R_2)$. The effective channel length of the transistor may be determined by subtracting the $\Delta w$ value from the length of the gate electrode.

30 Claims, 2 Drawing Sheets

TEST STRUCTURE FOR MEASURING EFFECTIVE CHANNEL LENGTH OF A TRANSISTOR

BACKGROUND OF THE INVENTION

1. Field of the Invention

The present invention is generally directed to the field of semiconductor processing, and, more particularly, to a method of measuring the effective channel length of a transistor, and a test structure for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, FIG. 1 depicts an illustrative prior art transistor 10 formed above a semiconducting substrate 11. The transistor 10 is generally formed in an active region 23 of the substrate 11 as defined by trench isolation regions 24. The transistor 10 is generally comprised of a gate insulation layer 13, a gate electrode 14, sidewall spacers 15, and source/drain regions 16. The gate electrode 14 also has a length, as indicated by the dimension 21. The various components of the transistor 10 shown in FIG. 1, as well as the methods of making such components, are well-known to those skilled in the art and will not be repeated in greater detail herein. At the point of fabrication depicted in FIG. 1, a layer of insulating material 17 and a plurality of conductive plugs 18 that are electrically coupled to the source/drain regions 16 have been formed above the transistor 10.

In modern semiconductor devices, an important parameter of transistor devices is the effective channel length ($L_{eff}$) of the device. For example, the effective channel length of a transistor has a great impact on a variety of device performance characteristics, e.g., the switching speed of the transistor, leakage currents, etc. In general, the effective channel length is defined as the distance between the source/drain regions 16, as indicated by the arrow 12 in FIG. 1. As shown in FIG. 1, the source/drain regions 16 extend somewhat under the sidewalls 20 of the gate electrode 14. The combined amount of this source/drain encroachment under the sidewalls 20 is generally referred to in the industry as "$\Delta L$." The effective channel length for a transistor may be determined by subtracting the $\Delta L$ value from the length 21 of the gate electrode 14 ($L_{eff}$=Gate Length–$\Delta L$).

A variety of techniques are employed in the industry in attempts to calculate or determine the effective channel length of a transistor. Some of those techniques involve applying a voltage across the source/drain regions 16, via conductive plugs 18, and employing a test instrumentation device 19 to measure a resistance of the channel region of the transistor 10. During the course of forming a transistor, a variety of dopant materials are implanted into the channel region of the transistor 10. For example, the channel region of a typical transistor may be subjected to threshold voltage implants, punch-through voltage implants, and so-called halo implants to achieve one or more desired effects on the resulting transistor. Unfortunately, it is believed that such heavy doping schemes lead to erroneous results from conventional transistor-based algorithms for calculating the effective channel length of the device, which make many assumptions about things such as channel doping levels and uniformity erroneous.

The present invention is directed to a method that may solve, or at least reduce, some or all of the aforementioned problems.

SUMMARY OF THE INVENTION

The present invention is directed to a method of measuring the effective channel length of a transistor, and a test structure for accomplishing same. In one illustrative embodiment, the structure is comprised of a first resistor comprised of a first doped region formed in a semiconducting substrate between a first pair of spaced-apart structures positioned above the substrate, the first resistor having a first width defined by the spacing between the first pair of structures, and a second resistor comprised of a second doped region formed in the substrate between a second pair of spaced-apart structures positioned above the substrate, the second resistor having a second width defined by the spacing between the second pair of structures. In the test structure, the width of the second resistor is greater than the width of the first resistor. The test structure further comprises a plurality of conductive contacts electrically coupled to each of the first and second doped regions. In another illustrative embodiment, the width of the second resistor is at least 1.5 times the width of the first resistor.

In one embodiment, the method disclosed herein comprises forming a first resistor comprised of a first doped region formed in a semiconducting substrate between a first pair of spaced-apart structures positioned above the substrate, the first resistor having a first width defined by the spacing between the first pair of structures, forming a second resistor comprised of a second doped region formed in the substrate between a second pair of spaced-apart structures positioned above the substrate, the second resistor having a second width defined by the spacing between the second pair of structures, the second width being greater than the first width, and forming a plurality of conductive contacts that are electrically coupled to each of the first and second doped regions. The method further comprises determining a resistance for each of the resistors by performing a process that at least comprises applying a voltage across the doped region of each of the first and second resistors, calculating, based upon the determined resistance of the first and second resistors, a $\Delta w$ value that corresponds to an amount of lateral encroachment of each of the doped regions under the spaced-apart structures, and determining an effective channel length for a transistor by subtracting the determined $\Delta w$ value from the length of a gate electrode of the transistor. In one particularly illustrative embodiment, the $\Delta w$ value may be calculated in accordance with the following equation: $\Delta w = (R_1 W_1 - R_2 W_2)/(R_1 - R_2)$.

BRIEF DESCRIPTION OF THE DRAWINGS

The invention may be understood by reference to the following description taken in conjunction with the accompanying drawings, in which like reference numerals identify like elements, and in which.

Figure 1:
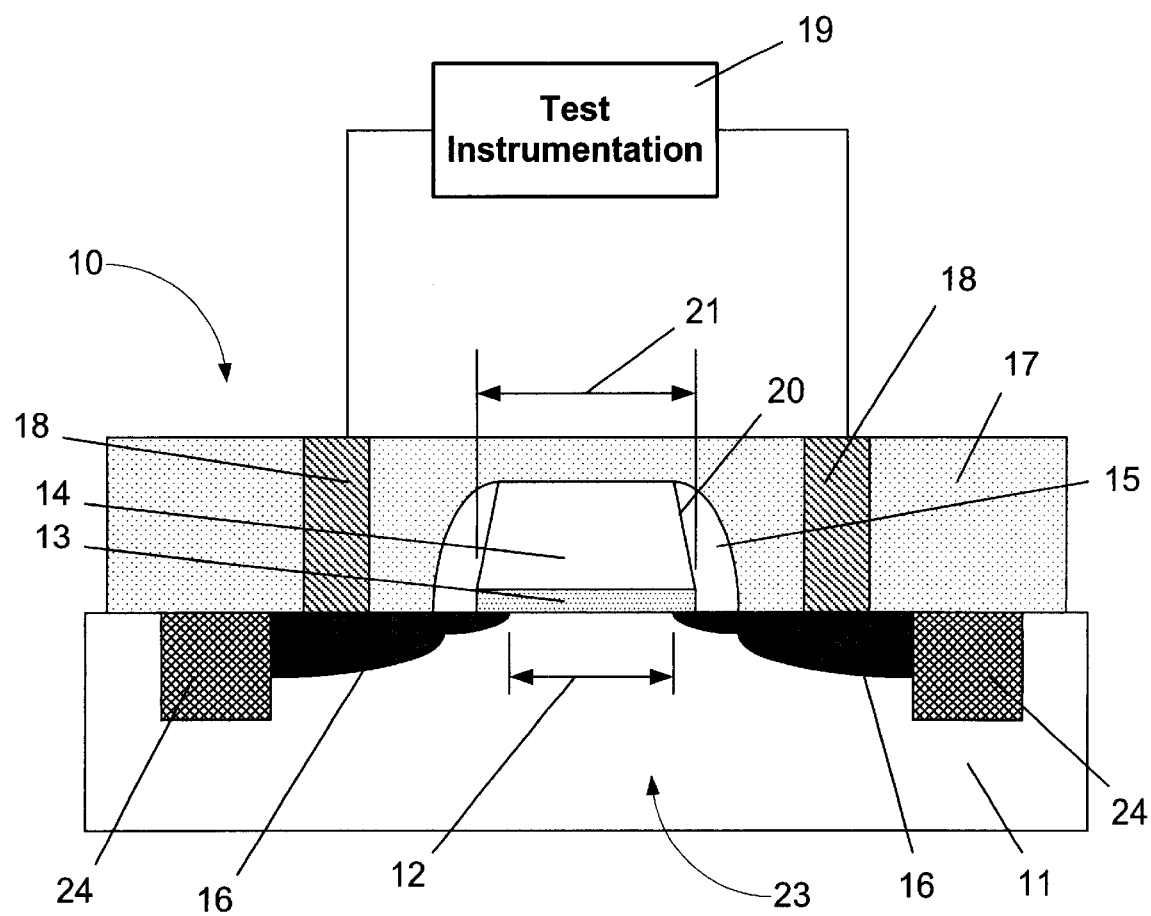
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives filling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of measuring the effective channel length of a transistor, and a test structure for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 3:
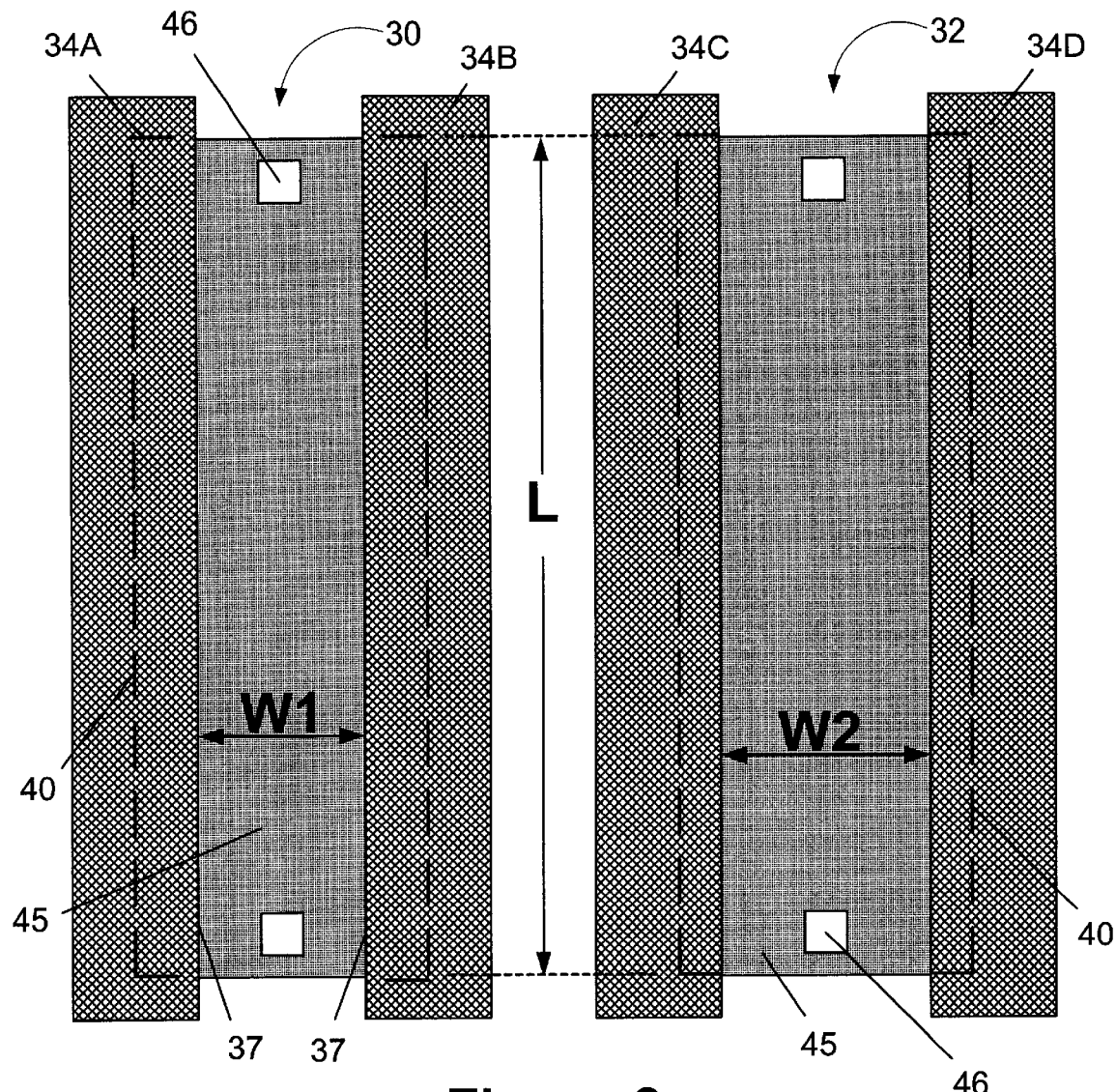
FIG. 3 is a plan view of the illustrative test structure shown in FIG. 2.
Figure 2:
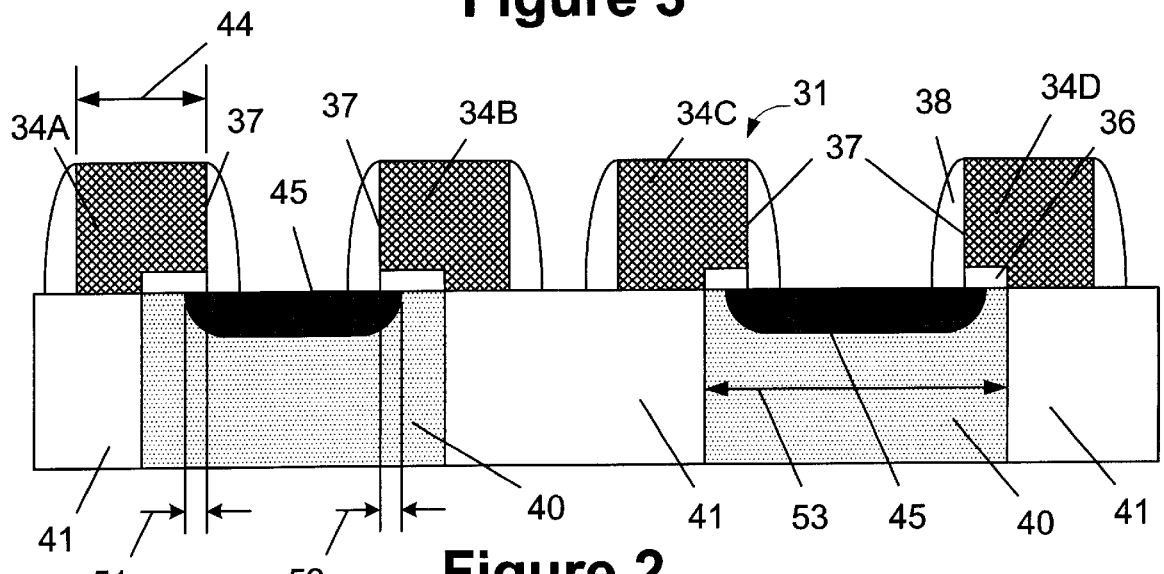
FIG. 2 is a cross-sectional view of an illustrative test structure in accordance with one embodiment of the present invention.

One illustrative test structure that may be employed with the present invention is depicted in FIGS. 2 and 3. As shown therein, the test structure is comprised of a first resistor 30 and a second resistor 32. The resistors 30, 32 depicted in FIGS. 2 and 3 may be formed from materials commonly used in semiconductor processing, and may be made using a variety of known manufacturing techniques. The present invention will be discussed in the context of determining the effective channel length for an illustrative NMOS transistor using the structures and methods described herein. However, as will be recognized by those skilled in the art after a complete reading of the present application, the present invention is readily applicable to other semiconductor devices, e.g., PMOS devices.

As shown in FIG. 2, a plurality of transistor-type structures 31 are formed above active regions 40 formed in a semiconducting substrate. The active regions 40 are defined by isolation regions 41 formed in the semiconducting substrate. The transistor structures are comprised of a gate electrode, a gate insulation layer 36, sidewalls 37, and sidewall spacers 38. For purposes of explanation, the gate electrodes have been numbered 34A–D, but they may be referred to generically by the number 34 An implant region 45 is formed between adjacent transistor-type structures 31 in each of the active areas 40, as shown in FIG. 2. The structures depicted in FIGS. 2 and 3 may be fabricated using a variety of known techniques. For example, active regions 40 may be defined in the substrate by forming trenches in the substrate and filling the trenches with an appropriate insulating material, e.g., silicon dioxide. The width 53 of the active regions 40 may be varied as a matter of design choice. Then, using a patterned layer of photoresist (not shown), a variety of ion implant processes may be performed on the active region 40. For example, for an illustrative NMOS transistor, a variety of implant processes, such as a threshold voltage implant, a punch-through implant, and a well implant, may be implanted into the active region 40. In effect, for an illustrative NMOS device, the active region 40 may be considered to be a P-well.

The gate insulation layer 36 may be comprised of a thermally grown layer of silicon dioxide having a thickness ranging from approximately 2–30 nm Although not important for purposes of the present invention, in the depicted embodiment, since the gate insulation layer 36 is thermally grown, it only extends to the edge of the active region 40. If desired, the gate insulation layer 36 could also be formed by a deposition process, such that the gate insulation layer 36 extends completely under the gate electrode 34. Alternatively, the width 53 of the active region 40 could be increased, such that a thermally grown layer of silicon dioxide would extend completely under the gate electrode 34. The length 44 of the gate electrodes 34A–D may be varied as a matter of design choice. In some embodiments, the length 44 of the gate electrodes 34A–D may range from approximately 0.18–0.5 μm, and they may have a thickness of approximately 0.05–0.4 μm. The sidewall spacers 38 may be comprised of a variety of materials, such as silicon dioxide or silicon oxynitride. The gate electrodes 34 may be comprised of any material suitable for such purposes, e.g., polysilicon, a metal, etc.

The gate electrodes 34 in the resistors 30, 32 are inactive, i.e., they are not coupled to any power supply. In effect, the gate electrodes 34 in the depicted embodiment are "dummy" spaced-apart structures. One or more of the test structures, comprised of resistors 30, 32, may be formed on test wafers or in the scribe lines of actual production wafers. Moreover, the resistors 30, 32 may be formed adjacent one another or they may be formed apart from one another in different regions of the substrate. Of course, more than one pair of resistors may be formed on a given wafer.

The implant regions 45 may be formed by performing a variety of implant processes typically performed on modern semiconductor devices. For an illustrative NMOS device, these implant regions would be formed using N-type dopant materials, e.g., arsenic, phosphorous. For example, the implant regions 45 may be formed using only a source/drain extension implant process that may be self-aligned with respect to the sidewalls 37 of the adjacent gate electrodes, i.e., gate electrodes 34A–B, 34C–D. Alternatively, the implant regions 45 may be formed by performing a source/drain extension implant process and a source/drain implant process performed after the sidewall spacers 38 are formed. Additional implants may also be performed to form the implant regions 45. Ultimately, the implant regions 45 should be implanted in accordance with the implant processes performed on actual production devices the results of which are desired to be tested using the present structure and methodology. It should also be noted that the implant regions 45 depicted in FIG. 2 are representative of the implant regions 45 after one or more anneal processes have been performed on the resistors 30, 32, i.e., after the implanted dopant atoms have migrated from their implanted position.

As shown in FIG. 3, in the first resistor 30, the distance between the sidewalls 37 of the gate electrodes 34A and 34B is represented by a dimension W1, whereas, the distance between the sidewalls 37 of the gate electrodes 34C and 34D of the second resistor structure 32 is represented by a dimension W2. That is, the first resistor 30 has a width W1 that is defined by the spaced-apart structures 34A–B. The second resistor 32 has a width W2 that is defined by the spaced-apart structures 34C–D.

The absolute values of W1 and W2 may be varied as a matter of design choice. For example, W1, the width of the narrowest resistor 30, may be of any desired size, e.g., as small as possible. Alternatively, the W1 dimension may be limited by certain design rules applicable to the semiconductor devices. For example, the design rules may establish a minimum spacing between adjacent polysilicon line-type structures, and W1 may be set at that minimum spacing. W2, the width of the widest resistor 32, may also vary as a matter of design choice. In general, the width W2 should be at least 1.5 times the width W1.

Moreover, as shown in FIG. 3, the active regions 40 have a length dimension "L" that is at least approximately twenty times the width of the narrower resistor 30 (20×W1). That is, the length of the active areas 40 is at least twenty times as long as the W1 dimension. Conductive contacts 46 are formed at each end of the implant region 45 for both of the resistors 30, 32. The contacts 46 may be comprised of a variety of materials and may take on a variety of shapes, e.g., circular, square, rectangular, etc. As will be recognized by those skilled in the art, the contacts 46 are the means by which electrical testing of the resistors 30, 32 will be performed.

The theory behind the methodology employed in the present invention may best be explained by the following mathematical equations:

$$R_W = R_1 (W_1 - \Delta w)/L \quad \text{(Equation 1)}$$

$$R_1 = R_2 (W_2 - \Delta w)/L \quad \text{(Equation 2)}$$

$$\Delta w = (R_1 W_1 - R_2 W_2)/(R_1 - R_2) \quad \text{(Equation 3)}$$

In the equations, $R_s$ is equal to the sheet resistance of the resistor, $R_1$ is the resistance of the first resistor 30, $W_1$ is the width of the first resistor 30, L is the length of the resistor, and $\Delta w$ is a factor representing the lateral extension of the doped regions under the gate electrodes. For example, with reference to FIG. 2, $\Delta w$ for the first resistor 30 is equal to the combined encroachment of the implant region 45 under the gate electrodes 34A–B, as represented by dimensions 51, 52. The dimensions 51, 52 may be different. The $R_s$ and $\Delta w$ values are, by definition, the same for both resistors 30, 32. Equation 2 is a similar equation except cast in terms of the characteristics of the second resistor 32. Equation 3 is the result of solving Equations 1 and 2 simultaneously with the premise that the length of both of the resistors is the same, and with the understanding that the sheet resistance ($R_s$) and $\Delta w$ are, by definition, equal for both resistors 30, 32.

The resistance of the first and second resistors, $R_1$ and $R_2$, respectively, are measured by simply forcing a voltage potential (V) between the contacts 46 for each resistor, measuring the current flowing in the resistor, and solving for the resistance in accordance with the equation R=V/I. Applying the resistance values for each resistor to Equation 3 above, $\Delta w$ may be readily calculated. The calculated factor $\Delta w$ is equal to the $\Delta l$ factor used in calculating the effective channel length of a transistor using traditional algorithms. Thus, the effective length of a channel of a transistor may be determined in accordance with the following equation:

$$L_{eff} = \text{Gate Length} - \Delta w \quad \text{(Equation 4)}$$

Through use of the present invention, the effective channel length of transistors may be determined irrespective of the nominal channel length of the devices.

The present invention is directed to a method of measuring the effective channel length of a transistor, and a test structure for accomplishing same. In one illustrative embodiment, the test structure is comprised of a first resistor 30 comprised of a first doped region 45 formed in a semiconducting substrate between a first pair of spaced-apart structures 34A–B positioned above the substrate, wherein the first resistor 30 has a first width (W1) defined by the spacing between the first pair of structures 34A–B, a second resistor 32 comprised of a second doped region 45 formed in the substrate between a second pair of spaced-apart structures 34C–D positioned above the substrate, wherein the second resistor 32 has a second width (W2) defined by the spacing between the second pair of structures 34C–D, the second width (W2) being greater than the first width (W1), and a plurality of conductive contacts 46 electrically coupled to each of the first and second doped regions 45. In another illustrative embodiment, the width (W2) of the second resistor is at least 1.5 times the width (W1) of the first resistor.

A method of determining an effective channel length of a transistor is also disclosed herein. In one embodiment, the method comprises forming a first resistor 30 comprised of a first doped region 45 formed in a semiconducting substrate between a first pair of spaced-apart structures 34A–B positioned above the substrate, the first resistor 30 having a first width (W1) defined by the spacing between the first pair of structures 34A–B, forming a second resistor 32 comprised of a second doped region 45 formed in the substrate between a second pair of spaced-apart structures 34C–D positioned above the substrate, the second resistor 32 having a second width (W2) defined by the spacing between the second pair of structures 34C–D, wherein the second width (W2) is greater than the first width (W1), and forming a plurality of conductive contacts 46 that are electrically coupled to each of the first and second doped regions 45. The method further comprises determining a resistance for each of the resistors 30, 32 by performing a process that at least comprises applying a voltage across the doped region 45 of each of the first and second resistors 30, 32, calculating, based upon the determined resistance of the first and second resistors 30, 32, a $\Delta w$ value that corresponds to an amount of lateral encroachment 51, 52 of each of the doped regions 45 under the spaced-apart structures, and determining an effective channel length for a transistor by subtracting the $\Delta w$ value from the length of a gate electrode of the transistor. For example, the $\Delta w$ value may be subtracted from the transistor length 21 of the transistor 10 depicted in FIG. 1.

Alternatively, assuming that the length 44 of the gate electrodes 34 correspond to the length of gate electrodes formed for production devices, the effective channel length for the production transistors may be determined by subtracting Δw from the length dimension 44.

In either case, this equates to subtracting the Δw value from the length of the gate electrode of the transistor in question.

The present invention is useful in calculating the effective channel length of a transistor. Moreover, it is believed that the present methodologies are not adversely impacted by the heavy doping of the channel regions in a transistor commonly found in modern semiconductor devices. As a result, more accurate and reliable information may be obtained as to the effective channel length of a transistor. In turn, this information may be used to adjust one or more process parameters and/or to eliminate or reduce the production of semiconductor devices of an unacceptable quality.

The particular embodiments disclosed above are illustrative only, as the invention may be modified and practiced in different but equivalent manners apparent to those skilled ink the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A test structure for use in determining an effective channel length of a transistor, comprising:
    a first resistor comprised of a first doped region formed in a semiconducting substrate between a first pair of spaced-apart inactive gate electrode structures positioned above said substrate, said first resistor having a first width defined by the spacing between said first pair of structures;
    a second resistor comprised of a second doped region formed in said substrate between a second pair of spaced-apart inactive gate electrode structures positioned above said substrate, said second resistor having a second width defined by the spacing between said second pair of structures, said second width being greater than said first width; and
    a plurality of conductive contacts electrically coupled to each of said first and second doped regions.

2. The test structure of claim 1, wherein said first and second doped regions are comprised of N-type dopant material.

3. The test structure of claim 1, wherein said first and second doped regions are comprised of P-type dopant material.

4. The test structure of claim 1, wherein each of said first and second resistors have a length that is at least twenty times said first width of said first resistor.

5. The test structure of claim 1, wherein said first and second resistors are formed in a scribe line of said semiconducting substrate.

6. The test structure of claim 1, wherein said first and second resistors are formed adjacent each other.

7. The test structure of claim 1, wherein said first and second doped regions are comprised of dopant material implanted in at least one of a source/drain extension implant process and a source/drain implant process.

8. The test structure of claim 1, further comprising first and second active regions formed in said substrate, said first and second doped regions being formed in said first and second active regions, respectively, said first and second active regions being doped with a dopant material that is of a type opposite of a dopant material used to form said first and second doped regions.

9. The test structure of claim 1, wherein said first and second pairs of structures are comprised of at least one of polysilicon and a metal.

10. A test structure for use in determining an effective channel length of a transistor, comprising:
    a first resistor comprised of a first doped region formed in a semiconducting, substrate between a first pair of spaced-apart inactive gate electrode structures positioned above said substrate, said first resistor having a first width defined by the spacing between said first pair of structures;
    a second resistor comprised of a second doped region formed in said substrate between a second pair of spaced-apart inactive gate electrode structures positioned above said substrate, said second resistor having a second width defined by the spacing between said second pair of structures, said second width being at least 1.5 times said first width of said first resistor; and
    a plurality of conductive contacts electrically coupled to each of said first and second doped regions.

11. The test structure of claim 10, wherein said first and second doped regions are comprised of N-type dopant material.

12. The test structure of claim 10, wherein said first and second doped regions are comprised of P-type dopant material.

13. The test structure of claim 10, wherein each of said first and second resistors have a length that is at least twenty times said first width of said first resistor.

14. The test structure of claim 10, wherein said first and second resistors are formed in a scribe line of said semiconducting substrate.

15. The test structure of claim 10,herein said first and second resistors are formed adjacent each other.

16. The test structure of claim 10, wherein said first and second doped regions are comprised of dopant material implanted in at least one of a source/drain extension implant process and a source/drain implant process.

17. The test structure of claim 10, further comprising first and second active regions formed in said substrate, said first and second doped regions being formed in said first and second active regions, respectively, said first and second active regions being doped with a dopant material that is of a type opposite of a dopant material used to form said first and second doped regions.

18. The test structure of claim 10, wherein said first and second pairs of structures are comprised of at least one of polysilicon and a metal.

19. A test structure for use in determining an effective channel length of a transistor, comprising:
    a first resistor comprised of a first doped region formed in a semiconducting substrate between a first pair of spaced-apart inactive gate electrode structures positioned above said substrate, said first resistor having a first width defined by the spacing between said first pair of structures;
    a second resistor comprised of a second doped region formed in said substrate between a second pair of spaced-apart inactive gate electrode structures positioned above said substrate, said second resistor having a second width defined by the spacing between said second pair of structures, said second width being at least 1.5 times said first width of said first resistor, each of said first and second resistors having a length that is at least 20 times said first width of said first resistor; and a plurality of conductive contacts electrically coupled to each of said first and second doped regions.

20. The test structure of claim 19, wherein said first and second doped regions are comprised of N-type dopant material.

21. The test structure of claim 19, wherein said first and second doped regions are comprised of P-type dopant material.

22. The test structure of claim 19, wherein said first and second resistors are formed in a scribe line of said semiconducting substrate.

23. The test structure of claim 19, wherein said first and second resistors are formed adjacent each other.

24. The test structure of claim 19, wherein said first and second doped regions are comprised of dopant material implanted in at least one of a source/drain extension implant process and a source/drain implant process.

25. The test structure of claim 19, further comprising first and second active regions formed in said substrate, said first and second doped regions being formed in said first and second active regions, respectively, said first and second active regions being doped with a dopant material that is of a type opposite of a dopant material used to form said first and second doped regions.

26. The test structure of claim 19, wherein said first and second pairs of structures are comprised of at least one of polysilicon and a metal.

27. A test structure for use in determining an effective channel length of a transistor, comprising:

a first resistor comprised of a first doped region formed in a semiconducting substrate between a first pair of spaced-apart structures positioned above said substrate, said first resistor having a first width defined by the spacing between said first pair of structures;

a second resistor comprised of a second doped region formed in said substrate between a second pair of spaced-apart structures positioned above said substrate, said second resistor having a second width defined by the spacing between said second pair of structures, said second width being greater than said first width, said first and second resistors being formed in a scribe line of said semiconducting substrate; and a plurality of conductive contacts electrically coupled to each of said first and second doped regions.

28. A test structure for use in determining an effective channel length of a transistor, comprising:

a first resistor comprised of a first doped region formed in a semiconducting substrate between a first pair of spaced-apart structures positioned above said substrate, said first resistor having a first width defined by the spacing between said first pair of structures;

a second resistor comprised of a second doped region formed in said substrate between a second pair of spaced-apart structures positioned above said substrate, said second resistor having a second width defined by the spacing between said second pair of structures, said second width being greater than said first width;

a plurality of conductive contacts electrically coupled to each of said first and second doped regions; and first and second active regions formed in said substrate, said first and second doped regions being formed in said first and second active regions, respectively, said first and second active regions being doped with a dopant material that is of a type opposite of a dopant material used to form said first and second doped regions.

29. A test structure for use in determining an effective channel length of a transistor, comprising:

a first resistor comprised of a first doped region formed in a semiconducting substrate between a first pair of spaced-apart structures positioned above said substrate, said first resistor having a first width defined by the spacing between said first pair of structures;

a second resistor comprised of a second doped region formed in said substrate between a second pair of spaced-apart structures positioned above said substrate, said second resistor having a second width defined by the spacing between said second pair of structures, said second width being at least 1.5 times said first width of said first resistor, said first and second resistors being formed in a scribe line of said semiconducting substrate; and a plurality of conductive contacts electrically coupled to each of said first and second doped regions.

30. A test structure for use in determining an effective channel length of a transistor, comprising:

a first resistor comprised of a first doped region formed in a semiconducting substrate between a first pair of spaced-apart structures positioned above said substrate, said first resistor having a first width defined by the spacing between said first pair of structures;

a second resistor comprised of a second doped region formed in said substrate between a second pair of spaced-apart structures positioned above said substrate, said second resistor having a second width defined by the spacing between said second pair of structures, said second width being at least 1.5 times said first width of said first resistor;

a plurality of conductive contacts electrically coupled to each of said first and second doped regions; and first and second active regions formed in said substrate, said first and second doped regions being formed in said first and second active regions, respectively, said first and second active regions being doped with a dopant material that is of a type opposite of a dopant material used to form said first and second doped regions.

* * * * *